(12) United States Patent
Shu et al.

(10) Patent No.: US 7,719,076 B2
(45) Date of Patent: May 18, 2010

(54) HIGH-VOLTAGE MOS TRANSISTOR DEVICE

(75) Inventors: Shih-Ming Shu, Yun-Lin County (TW);
Chih-Jen Huang, Hsinchu (TW);
Tun-Jen Cheng, Hsinchu (TW);
Chao-Yuan Su, Hsinchu (TW)

(73) Assignee: United Microelectronics Corp., Hsin-Chu (TW)

( * ) Notice: Subject to any disclaimer, the term of this patent is extended or adjusted under 35 U.S.C. 154(b) by 127 days.

(21) Appl. No.: 11/836,788

(22) Filed: Aug. 10, 2007

(65) Prior Publication Data
US 2009/0039425 A1    Feb. 12, 2009

(51) Int. Cl.
H01L 29/86 (2006.01)
(52) U.S. Cl. .................. 257/488; 257/E29.325
(58) Field of Classification Search ........... 257/409, 257/335, 339, 491, 488, 492, E29.325
See application file for complete search history.

(56) References Cited

U.S. PATENT DOCUMENTS

| | | | |
|---|---|---|---|
| 4,419,812 A * | 12/1983 | Topich | 438/238 |
| 5,434,445 A * | 7/1995 | Ravanelli et al. | 257/488 |
| 5,646,431 A * | 7/1997 | Hsu et al. | 257/342 |
| 6,664,593 B2 | 12/2003 | Peake | |
| 6,873,011 B1 * | 3/2005 | Huang et al. | 257/345 |
| 2001/0030346 A1 * | 10/2001 | Jeon et al. | 257/339 |
| 2005/0194656 A1 | 9/2005 | Shimizu | |
| 2006/0270171 A1 | 11/2006 | Chen et al. | |
| 2007/0278568 A1 * | 12/2007 | Williams et al. | 257/335 |
| 2008/0299751 A1 * | 12/2008 | Quddus et al. | 438/571 |

FOREIGN PATENT DOCUMENTS

| | | |
|---|---|---|
| CN | 1301045 A | 6/2001 |
| CN | 1424770 A | 6/2003 |

* cited by examiner

Primary Examiner—Nathan W Ha
(74) Attorney, Agent, or Firm—Winston Hsu

(57) ABSTRACT

A HV MOS transistor device having a substrate, a gate, a source, a drain, a first ion well of a first conductive type disposed in the substrate, and a plurality of field plates disposed on the substrate is disclosed. The HV MOS transistor device further has a first doped region of a second conductive type positioned in the first ion well. Therefore, a first interface and a second interface between the first ion well and the first doped region are formed, and the first interface and the second interface are respectively positioned near the drain and the source. In addition, the first interface is positioned under a respective field plate to produce a smooth field distribution and to increase the breakdown voltage of the HV transistor device.

27 Claims, 6 Drawing Sheets

HIGH-VOLTAGE MOS TRANSISTOR DEVICE

BACKGROUND OF THE INVENTION

1. Field of the Invention

The present invention relates to a high-voltage MOS (HV MOS) transistor device, and particularly, to a HV MOS transistor device having a P doped region positioned in an N ion well and a plurality of field plates to produce a smooth field distribution when subject to a high drain voltage and prevent the HV MOS transistor device from breakdown.

2. Description of the Prior Art

Current power systems provide an alternating current having a variety of frequencies ranging from 50 to 60 Hz, and a voltage ranging from 100 to 240 volts (V). Every electrical device has a particular working voltage and frequency condition, and therefore, electrical devices and related passive elements utilized in the electrical devices, such as inductors, capacitors, resistors and transformers, act as a switch to determine the value of the voltage and the type of the current thereof. For example, a conventional air conditioner utilizes a power supply providing a low-voltage current for the inner facilities. The power supply switch reduces the voltage provided by the outer power system to an appropriate voltage for the inner facilities. In addition, the power supply switch has the characteristics of high efficiency, low weight, small size and reduced power consumption. High-voltage metal-oxide semiconductor (HV MOS) transistor devices may function as switches and are broadly utilized in CPU power supplies, power management systems, AC/DC converters, LCD/plasma TV drivers, automobile electronic components, PC peripheral devices, small DC motor controllers, and other consumer electronic devices.

Here, the structure of a prior art HV MOS transistor device is described briefly. Please refer to FIG. 1. FIG. 1 is a schematic diagram of a prior art HV MOS transistor device 1. The HV MOS transistor device 1 is formed on a semiconductor substrate 2. The HV MOS transistor device 10 has a source 3, a gate 4, and a drain 5. The source 3 is positioned next to a heavily P doped region 6. Both the source 3 and the heavily P doped region 6 are formed in a P-type well 7. The drain 5 is formed in an N well 8 that is formed in a deep N well 9, forming a triple-well structure. As shown in FIG. 1, a gate dielectric layer 10 is formed on the source 3. The gate 4 is disposed on the gate dielectric layer 10 and extended to approach a field oxide 11 disposed between the source 3 and the drain 5. The active area of the HV MOS transistor device 1 is isolated by a plurality of field oxide layers 12 from other devices formed on the same semiconductor substrate 2. In addition, another HV MOS transistor device, in which a P doped region is used inside the N well, is disclosed. The device is optimized to increase the breakdown voltage thereof. However, the power source supplied by the outer voltage source is an AC power. The usual waveform of an AC power circuit is a sine wave, and a 240V AC power may alter its voltage from −300V to +300V. The voltage may be over 600V in an instant. This is greater than the breakdown voltage of most HV MOS transistor devices in the field and leads to HV MOS transistor device damage. Therefore, an HV MOS transistor device capable of withstanding high voltages is required.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

The present invention discloses a HV MOS transistor device, which has both of the field plates and a P doped region inside the N well. The HV MOS transistor device is optimized to produce a smooth field distribution when subject to high drain voltages.

Therefore, a HV MOS transistor device is disclosed. The HV MOS transistor device has a substrate of a first conductive type, and a source and a drain of a second conductive type disposed on the substrate. The HV MOS transistor device further has a first ion well of the second conductive type, an isolation structure, a gate dielectric layer, and a gate. The first ion well is disposed around the drain in the substrate. The isolation structure is positioned on a surface of the substrate between the source and the drain. The gate dielectric layer is positioned on the surface of the substrate between the isolation structure and the source. The gate of the HV MOS transistor device is disposed on the gate dielectric layer and extended to approach the isolation structure. In addition, the HV MOS transistor device of the present invention has a plurality of field plates disposed on the isolation structure, and at least a first doped region of the first conductive type disposed inside the first ion well. The first doped region has a first interface, which is formed between the first doped region and the first ion well. The first interface is positioned near the drain and disposed under any one of the field plates.

In order to smooth the distribution of the electrical field, the HV MOS transistor device of the present invention has the first interface positioned under one of the field plates. The HV MOS transistor device overcomes disadvantages discussed previously and work effectively when subject to high voltages.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
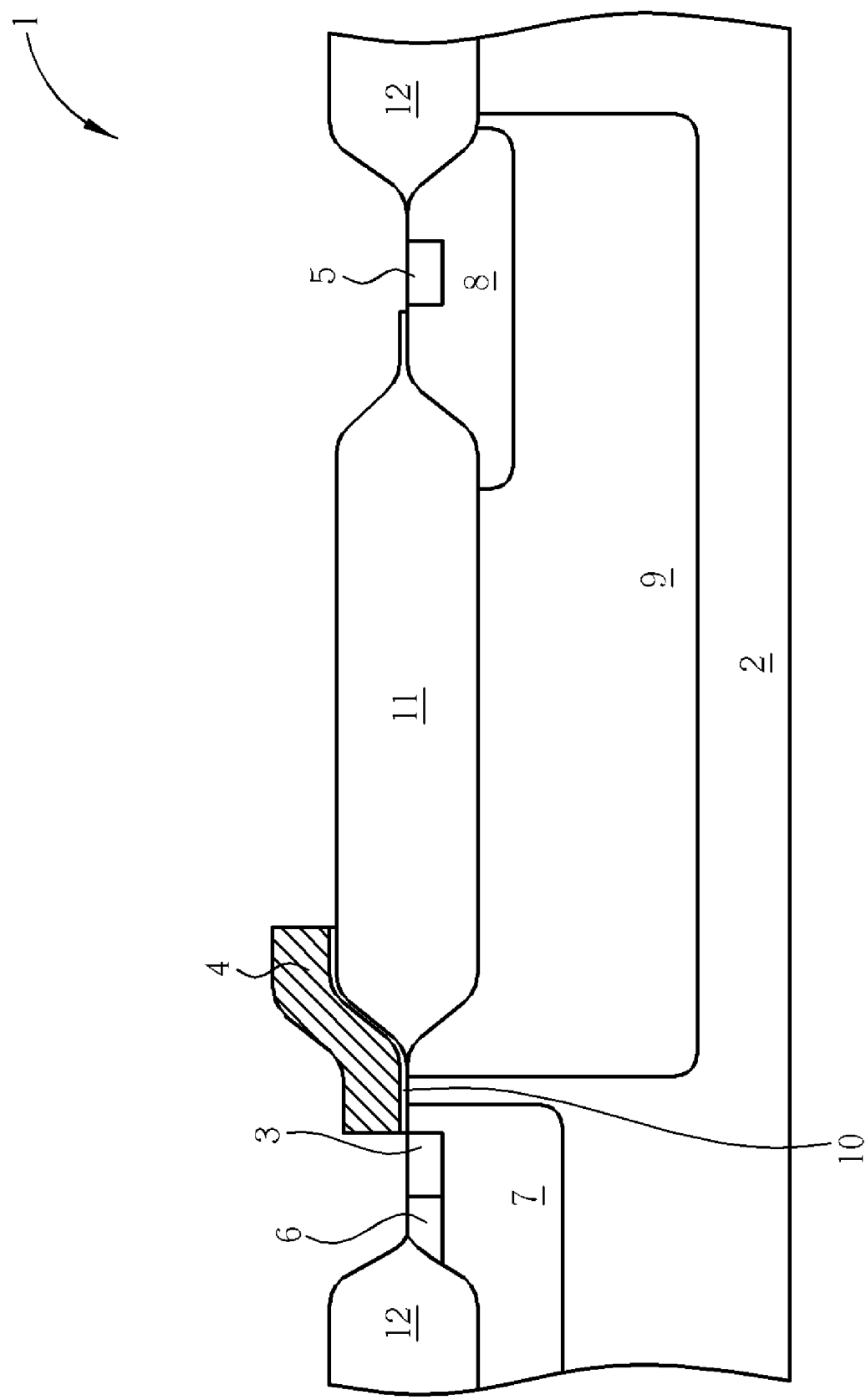
FIG. 1 is a schematic diagram of a prior art HV MOS transistor device.

Hereinafter, preferred embodiments of the present invention will be described with reference to the accompanying drawings, in which components with substantially the same functions are identified by the same reference numeral for the sake of simplicity. The following description of the present invention will focus on a HV MOS transistor device with a high breakdown voltage of at least 700V. It should be noted, however, that the present invention is in no way limited to the following illustrative embodiments. While the following discussions are described below using P-channel devices, the discussion also pertains to N-channel devices, which may be formed by reversing the conductivity of the described regions and layers.

Figure 2:
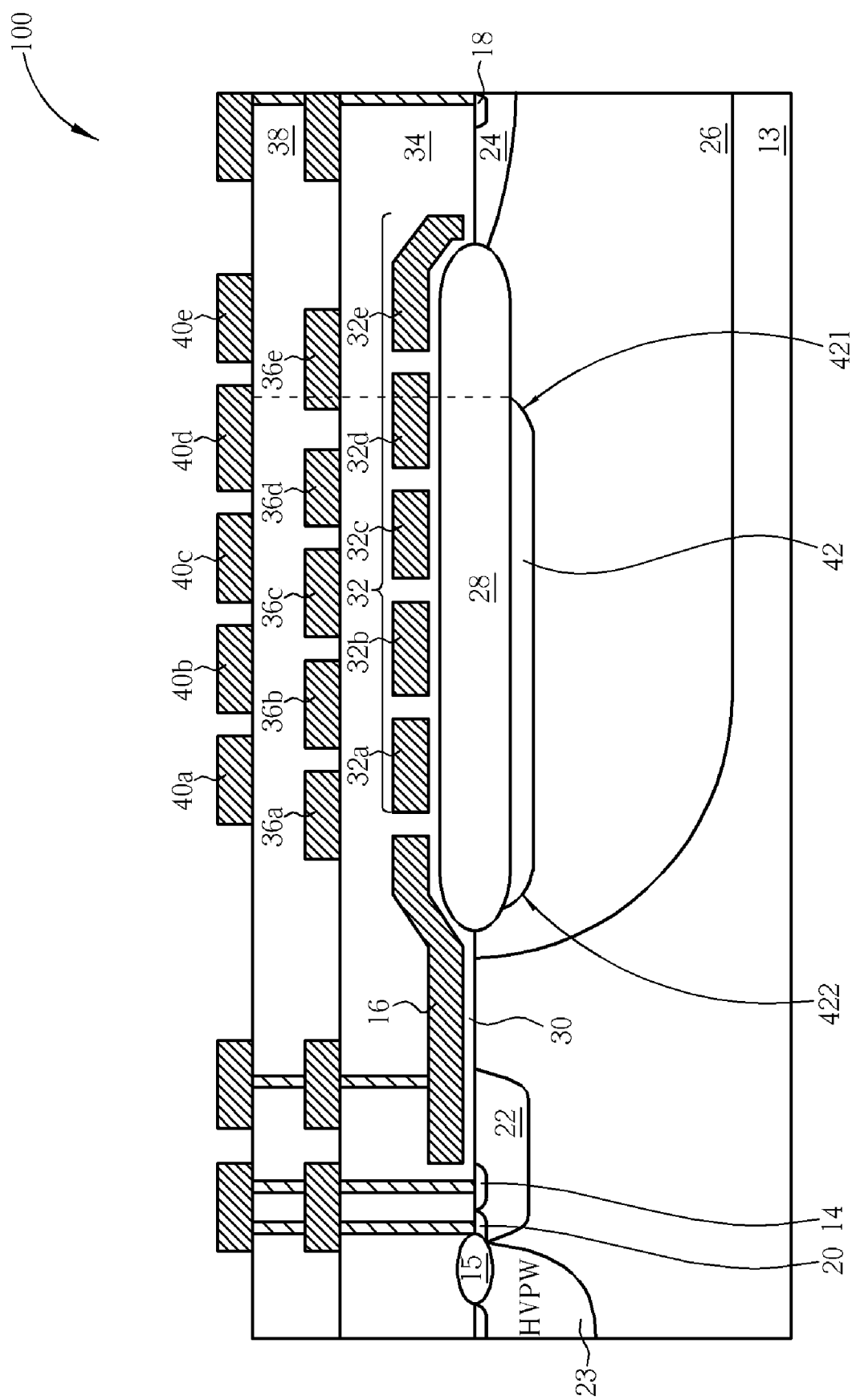
FIG. 2 shows a cross-section diagram of a HV MOS transistor device according to a first preferred embodiment of the present invention.

Please refer to FIG. 2, which shows a cross-section diagram of a HV MOS transistor device 100 according to a first preferred embodiment of the present invention. The HV MOS transistor device 100 is formed on a substrate 13, such as a P doped silicon substrate, and the active area of the HV MOS transistor device 100 is isolated by at least an isolation structure, such as a field oxide layer 15, or at least a shallow trench isolation (not shown). The HV MOS transistor device 100 has a source 14, a gate 16, and a drain 18. The source 14 is a heavily N doped region and positioned next to a third heavily P doped region 20. Both the source 14 and the third heavily P doped region 20 are formed in a second P doped region 22. Next to the second P doped region 22 is a high-voltage P doped well 23. The drain 18 is a heavily N doped region and is formed in a second N ion well 24, which is formed in a first deep N ion well 26, forming a triple-well structure.

As shown in FIG. 2, another isolation structure is disposed on a part of the first deep N ion well 26 and next to the second N ion well 24. The isolation structure may be a field oxide 28 or at least a shallow trench isolation (not shown). The HV MOS transistor device 100 further has a gate dielectric layer 30 formed on a surface of the substrate 13 between the source 14 and the field oxide 28. The gate dielectric layer 30 comprises silicon oxide or silicon nitride, and is formed by deposition or a thermal oxidation process. The gate 16 comprising polysilicon or other conductive material is disposed on the gate dielectric layer 30 and extended to approach the field oxide 28. The HV MOS transistor device 100 also has a plurality of field plates 32 covering on the field oxide 28, and a first dielectric layer 34 disposed on the gate 16, the doped regions, the ion wells, the field oxide 28, and the field plates 32a-e. The field plates 32 includes a plurality of planar field plates 32a, 32b, 32c and 32d formed on the surface of the field oxide 28, and a edge field plate 32e formed at the edge of the field plate 28 and nearing to the second N ion well 24. A plurality of first conductive layer 36a, 36b, 36c, 36d, 36e is formed on the first dielectric layer 34, and a second dielectric layer 38 is formed covering on the first conductive layer 36a-e. A plurality of second conductive layers 40a, 40b, 40c, 40d, and 40e is formed on the second dielectric layer 38. The first field plates 32 are respectively positioned between each of the first conductive layers 36a-e, and the second conductive layers 40a-e are respectively positioned between each of the field plates 32. For the sake of simplicity, four planer field plates 32a-d, five first conductive layers 36a-e, and five second conductive layers 40a-e are shown in the present embodiment. The planer field plates 32a-d all have the same critical dimension. The critical dimension of the field plates, the interval between each field plates, and the quantities of the field plate(s) may be modified as required, and so as to the first conductive layer(s) and the second conductive layer(s).

In order to increase the breakdown voltage of the HV MOS transistor device 100, a first P doped region 42 is formed under the field oxide 28 and positioned inside the first deep N ion well 26. The first P doped region 42 is positioned between the second P doped region 22 and the second N ion well 24. With carefully selected doping, the first P doped region 42 depletes at the same time as the deep N ion well 26 when the drain voltage is high. The HV MOS transistor device 100 is optimized to produce a smooth electrical field distribution when subject to high drain voltages. In addition, the field plates 32 also function as the first P doped region 42 to smooth electrical field distribution. Therefore, the HV MOS transistor device 100 of the present invention has a higher breakdown voltage than those of the prior art.

For the sake of simplicity, FIG. 2 only shows one first P doped region 42 positioned adjacent to the top of the first deep N ion well 26. However, the quantity and the positioned of the first P doped region 42 are not limited to this. The first P doped region 42 may be formed deeper inside the first deep N ion well 26, or multiple layers of the first P doped region 42 may be distributed through the first deep N ion well 26, which is illustrated with reference to FIG. 4.

Figure 3:
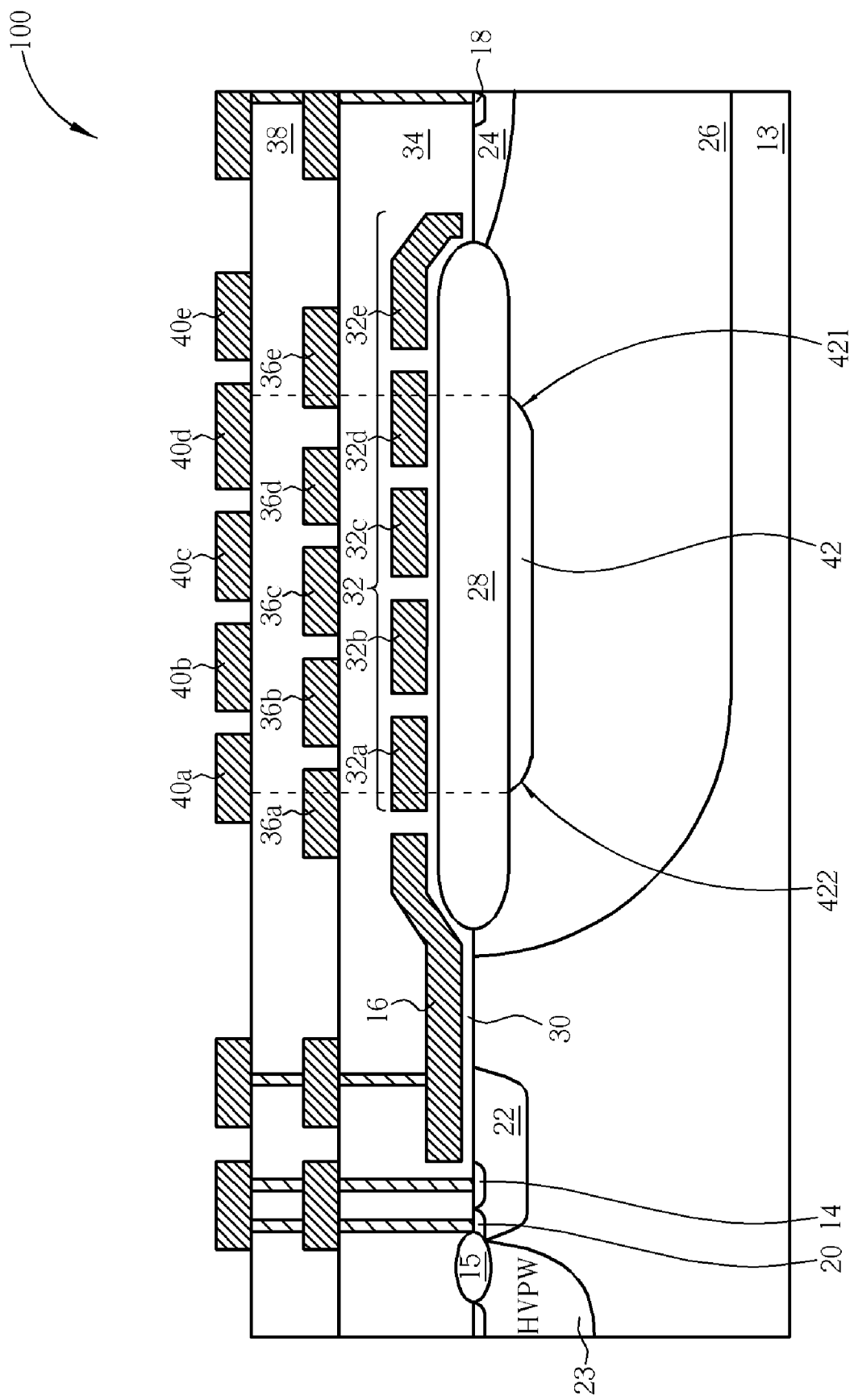
FIG. 3 shows a cross-section diagram of a HV MOS transistor device according to a second preferred embodiment of the present invention.
Figure 4:
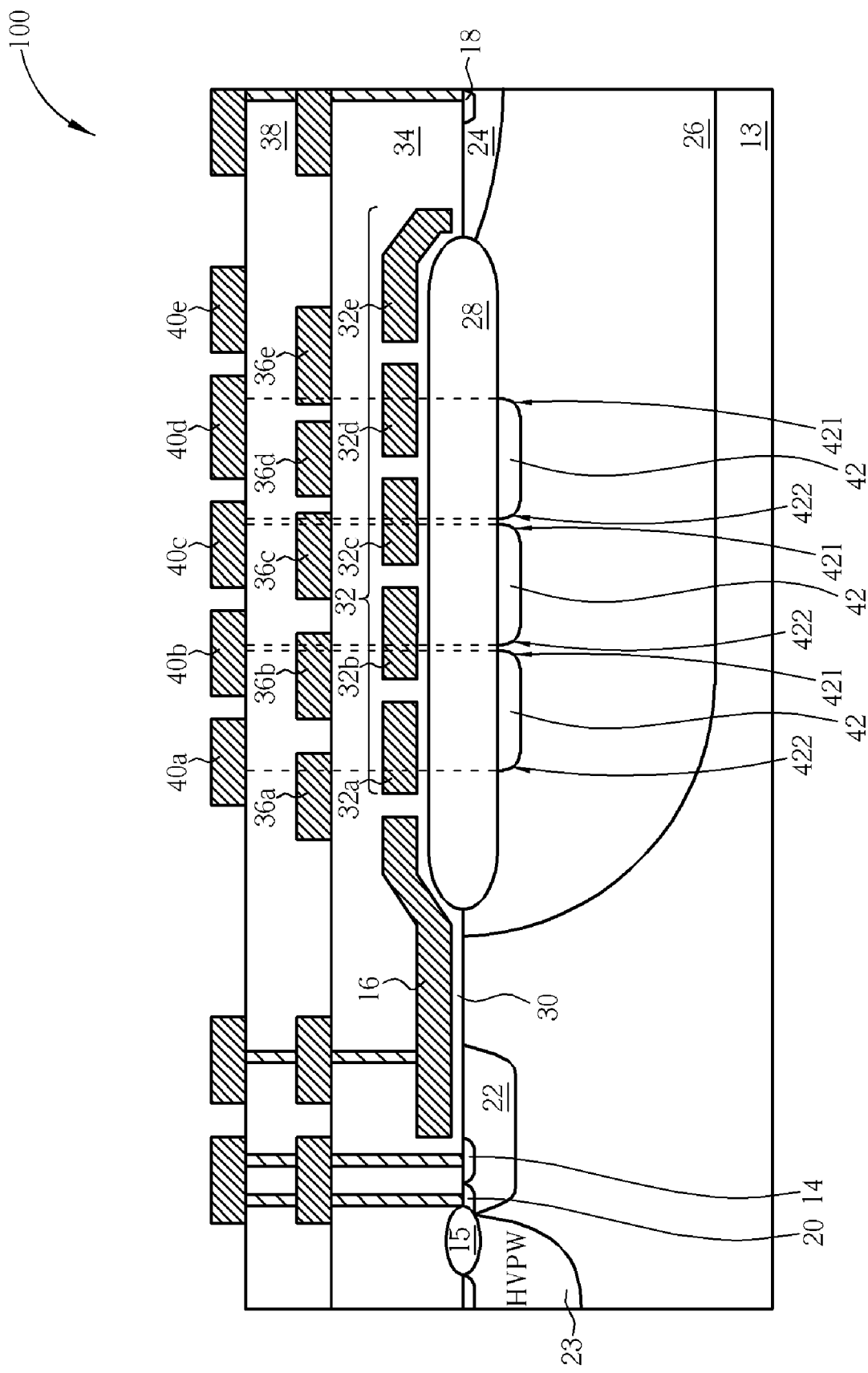
FIG. 4 shows a cross-section diagram of a HV MOS transistor device according to a third preferred embodiment of the present invention.

Since the first P doped region 42 is formed in the first deep N ion well 26, a first interface 421 is formed between the first deep N ion well 26 and the first P doped region 42 near the drain 18. A second interface 422 is formed between the first deep N ion well 26 and the first P doped region 42 near the source 14. It should be noted that at least one of the field plates 32 of the present invention is formed above and covering the first interface 421 or the second interface 422. Particularly, the first interface 421 between the between the first deep N ion well 26 and the first P doped region 42 near the drain 18 should be covered. As shown in FIG. 2, at least a field plate, such as one of the planar field plate 32a-d is formed directly above the first interface 421, and preferably, the planar field plate 32d positioned next to the edge field plate 32e is formed directly above the first interface 421. In FIG. 2, the first interface 421 is positioned respectively at the right side of the planar field plate 32d. The length of the first P doped region 42 may be modified, and the position of the interface may be shifted to the left side or any other location in a region under the planar field plate 32d. The objective of positioning the first interface 421 under the planar field plate 32d is to smooth the electrical field distribution and to reduce the electrical field around the first interface 421. Furthermore, another HV MOS transistor device according to a second preferred embodiment of the present invention is shown in FIG. 3, in which the components with substantially the same functions are identified by the same reference numeral for the sake of simplicity. As shown in FIG. 3, the second interface 422 between the first P doped region 42 and the first deep N ion well 26 near the source 14 is preferably positioned under at least one of the planar field plates 32a-d, such as the field plate 32a. With reference to FIG. 4, which is a schematic diagram of a HV MOS transistor device according to a third preferred embodiment of the present invention. When the first P doped region 42 are formed as multi-layers, each of the first interface 421 and the second interface 422 is positioned under a respective planar field plate 32a-d.

The electrical field may be formed by the bias between the drain 18 and source 14 coupling to the first conductive layers 36a-e and the second conductive layers 40a-e. It is preferred to locate each first interface 421 or each second interface 422 under these conductive layers. For example, the first conductive layer 36e and the second conductive layer 40d are positioned directly above the first interface 421, which is shown in FIGS. 3-4. The first conductive layer 36a and the second conductive layer 40a are positioned directly above the second interface 422, which is shown in FIGS. 2-4. Therefore, the electrical field distribution near the first interface 421 is smooth, and that prevents the HV MOS transistor device 100 from breakdown. In addition, the field plates 32, the first conductive layers 36a-e, or the second conductive layers 40a-e may be formed as a floating structure. A bias can be applied on the field plates 32, the first conductive layers 36a-e, or the second conductive layers 40a-e, respectively.

Figure 5:
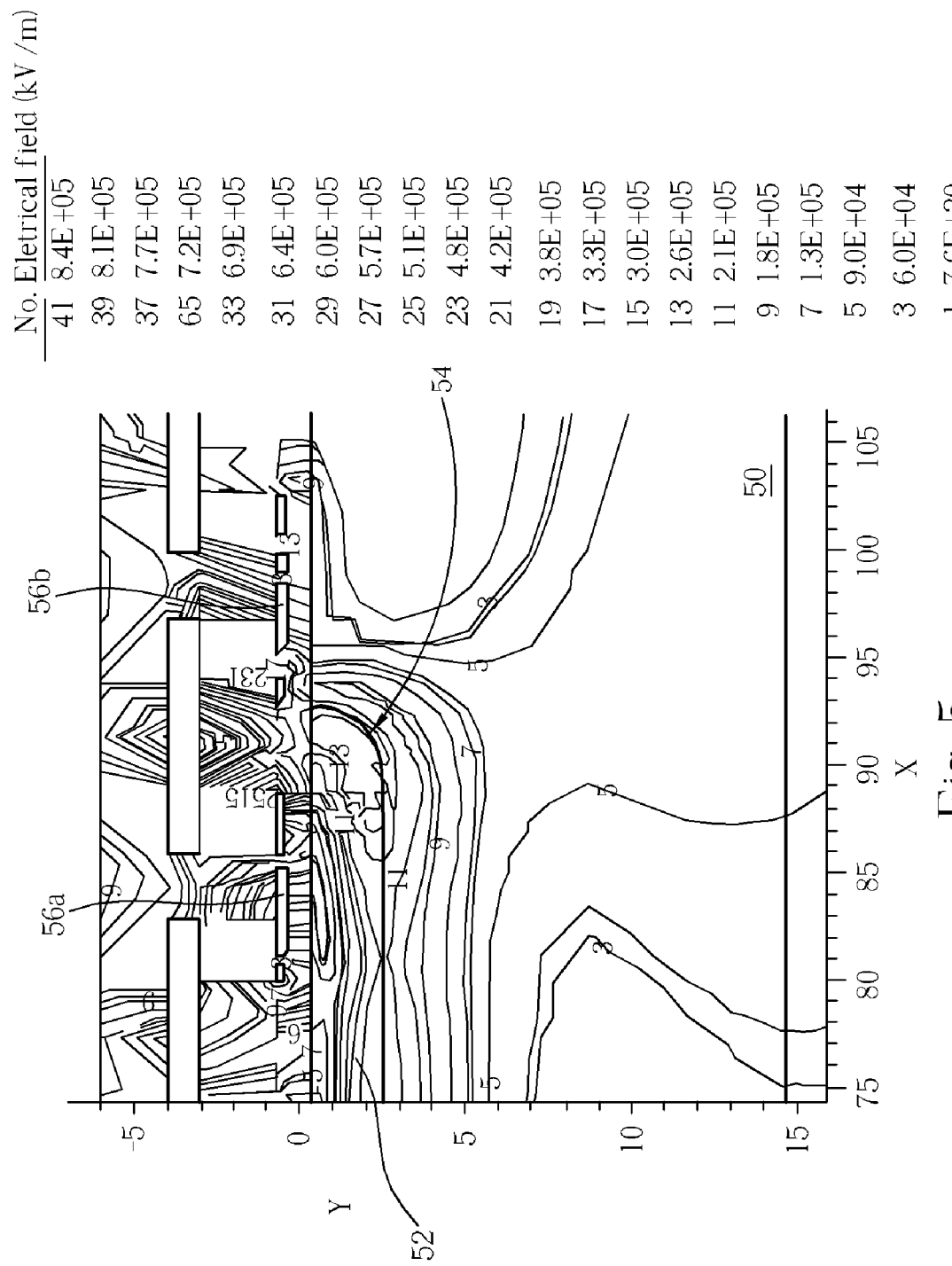
FIG. 5 is a schematic diagram illustrating the distribution of electrical field lines of a HV MOS transistor device.

Please refer to FIG. 5, which is a schematic diagram illustrating the distribution of electrical field lines when a HV MOS transistor device is working. The HV MOS transistor device has a first interface 54 of a first deep N ion well 50 and a first P doped region 52 near a drain thereof. The interface 54 is respectively positioned between two field plates 56a and 56b, without covering by any field plate. As shown in FIG. 5, the electrical lines around the first interface 54 are highly concentrated. The major electrical field lines around the first interface are No. 3 to No. 13. The maximal electrical field around the first interface is about $2.61 \times 10^5$ MV/cm, which refers to No. 13. And the breakdown voltage of the HV MOS transistor device is about 277 Volt.

Figure 6:
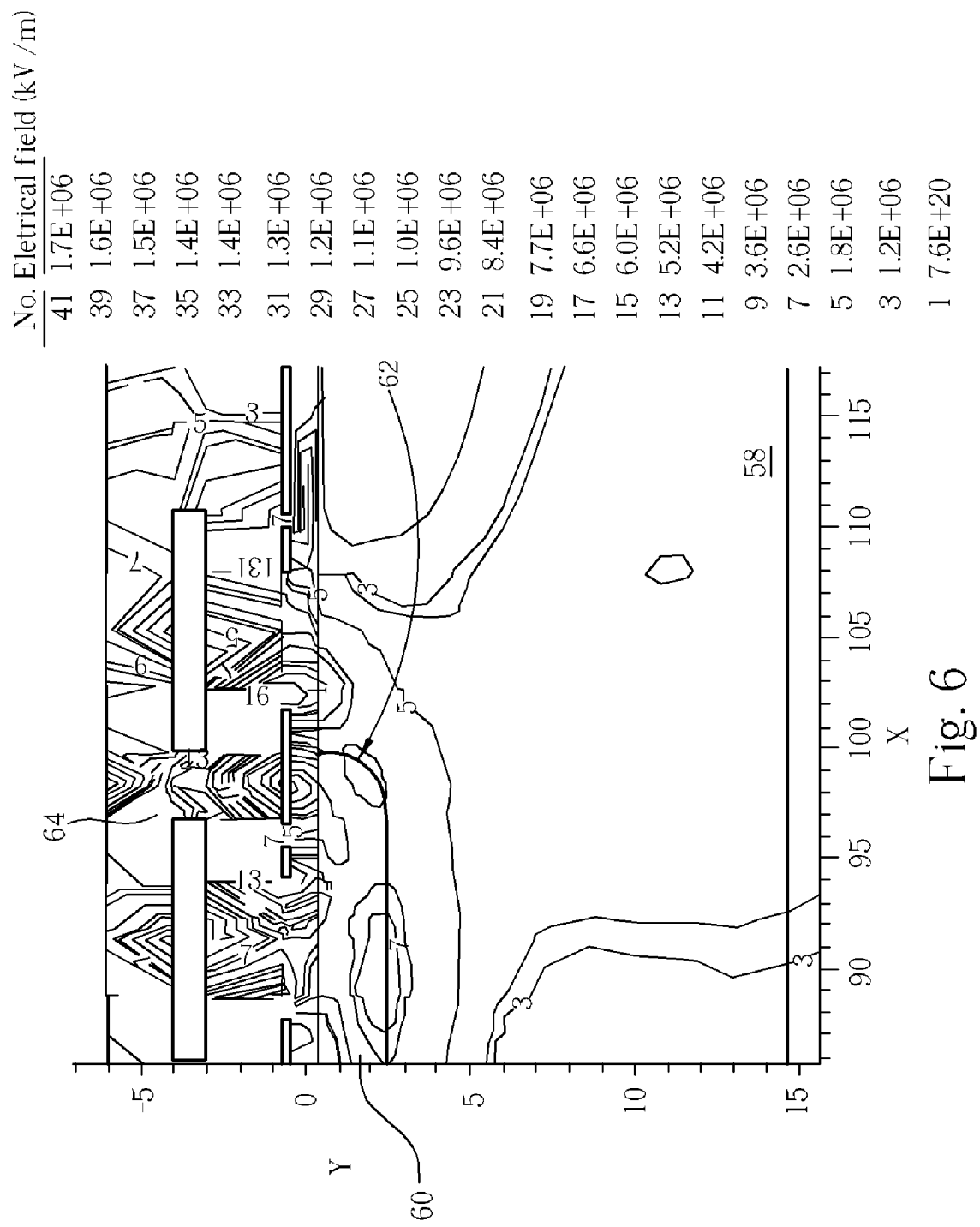
FIG. 6 is a schematic diagram illustrating the distribution of electrical field lines of a HV MOS transistor device of the present invention.

Please refer to FIG. 6, which is another schematic diagram illustrating the distribution of electrical field lines when a HV MOS transistor device having a first interface 62 under a field plate 64 is working. The first interface 62 between the first deep N ion well 58 and the first P doped region 60 near the drain is directly positioned under the field plate 64 of the HV MOS transistor device. Comparing FIG. 5, the distribution of electrical field lines in FIG. 5 is smooth. The major electrical field lines around the first interface are No. 3 to No. 5. The maximal electrical field around the first interface in FIG. 6 is about $1.81 \times 10^5$ MV/cm. The breakdown voltage of the HV MOS transistor device having the first interface 62 under the field plate 64 is about 562 Volt, which is higher than that of the HV MOS transistor device having the first interface 54 respectively positioned between the field plates 56a and 56b shown in FIG. 5. Accordingly, those skilled in the art should realized that the HV MOS transistor devices locating the interface between the N ion well and the P doped region under the field plate to smooth the electrical field distribution and to improve the breakdown voltage of the device.

As illustrated above, the HV MOS transistor of the present invention having the interface between the P doped region and the N ion well disposed in a region under any one of the field plates to smooth the electrical field distribution and to increase breakdown voltage thereof. The length of the P doped region may be modified to place the interface between the P doped region and the N ion well under one of the field plates of the HV MOS transistor of the present invention. The P dope region may be a flat structure shown in FIG. 2-3, or as multi-layers shown in FIG. 4 that having interfaces between the P doped region and the N ion well positioned under a respective field plate. Both types of the P doped region result in HV MOS transistor devices of a high breakdown voltage.

Those skilled in the art will readily observe that numerous modifications and alterations of the device and method may be made while retaining the teachings of the invention.

What is claimed is:

1. A HV MOS transistor device, comprising:
   a substrate of a first conductive type;
   a source of a second conductive type disposed on the substrate;
   a drain of the second conductive type disposed on the substrate;
   a first ion well of the second conductive type disposed around the drain in the substrate;
   an isolation structure disposed on a surface of the substrate between the source and the drain;
   a gate dielectric layer disposed on the surface of the substrate between the source and the isolation structure;
   a gate disposed on the gate dielectric layer and extended to the isolation structure;
   a plurality of field plates covering the isolation structure; and
   at least a first doped region of the first conductive type disposed in the first ion well and between the source of the second conductive type and the drain of the second conductive type, and a first interface between the first ion well and the first doped region near the source disposed in a region under any one of the field plates;
   wherein the first doped region is completely disposed under the isolation structure and completely isolated by the first ion well.

2. The HV MOS transistor device of claim 1, wherein a second interface between the first ion well and the first doped region near the source is disposed in a region under one of the field plates.

3. The HV MOS transistor device of claim 1, further comprising a second ion well of the second conductive type disposed around the drain in the substrate.

4. The HV MOS transistor device of claim 1, further comprising:
   a third doped region of the first conductive type disposed adjacent to the source in the substrate; and
   a second doped region of the first conductive type disposed around the source and the third doped region.

5. The HV MOS transistor device of claim 3, wherein the field plates includes a plurality of planar field plates and an edge field plate, and the edge field plate is formed at the edge of the field oxide and nearing the second ion well.

6. The HV MOS transistor device of claim 5, wherein the first interface is disposed under one of the planar field plates.

7. The HV MOS transistor device of claim 5, wherein the first interface is disposed under the planer filed plate next to the edge field plate.

8. The HV MOS transistor device of claim 1, further comprising:
   a first dielectric layer covering the substrate, the source, the drain, and the field plates; and
   a plurality of first conductive layers disposed on the first dielectric layer.

9. The HV MOS transistor device of claim 8, wherein the first interface is disposed in a region under any one of the first conductive layers.

10. The HV MOS transistor device of claim 8, wherein the second interface is disposed in a region under another first conductive layer.

11. The HV MOS transistor device of claim 8, further comprising:
    a second dielectric layer disposed on the first dielectric layer and covering the first conductive layer; and
    a plurality of second conductive layers disposed on the second dielectric layer.

12. The HV MOS transistor device of claim 11, wherein the first interface is disposed in a region under any one of the second conductive layers.

13. The HV MOS transistor device of claim 11, wherein the second interface is disposed in a region under any one of the second conductive layers.

14. A HV MOS transistor device, comprising:
    a substrate of a first conductive type;
    a source, a gate and a drain disposed on the substrate;
    a first ion well of a second conductive type disposed around the drain in the substrate;
    an isolation structure disposed on a surface of the substrate between the source and the drain;
    at least a first doped region of the first conductive type disposed in the first ion well and between the source and the drain, wherein the first doped region is completely disposed under the isolation structure and completely isolated by the first ion well, the first doped region comprising:
a first interface between the first ion well and the first doped region disposed near the drain; and
a second interface between the first ion well and the first doped region disposed near the source; and
a plurality of field plates disposed on the substrate between the source and the drain, one of the field plates being disposed above the first interface.

15. The HV MOS transistor device of claim 14, wherein another field plate is disposed above the second interface.

16. The HV MOS transistor device of claim 14, further comprising
a gate dielectric layer disposed under the gate and extended to the surface of the substrate between the source and the isolation structure.

17. The HV MOS transistor device of claim 14, further comprising a second ion well of the second conductive type disposed around the drain in the substrate.

18. The HV MOS transistor device of claim 14, further comprising:
a third doped region of the first conductive type disposed adjacent to the source in the substrate; and
a second doped region of the first conductive type disposed around the source and the third doped region.

19. The HV MOS transistor device of claim 17, wherein the field plates includes a plurality of planar field plates and an edge field plate, and the edge field plate is formed at the edge of the field oxide and nearing the second ion well.

20. The HV MOS transistor device of claim 19, wherein the first interface is disposed under one of the planar field plates.

21. The HV MOS transistor device of claim 19, wherein the first interface is disposed under the planer filed plate next to the edge field plate.

22. The HV MOS transistor device of claim 14, further comprising:
a first dielectric layer covering the substrate, the source, the drain, and the field plates; and
a plurality of first conductive layers disposed on the first dielectric layer.

23. The HV MOS transistor device of claim 22, wherein one of the first conductive layers is disposed above the first interface.

24. The HV MOS transistor device of claim 22, wherein another first conductive layer is disposed above the second interface.

25. The HV MOS transistor device of claim 22 further comprising:
a second dielectric layer disposed on the first dielectric layer and covering the first conductive layer; and
a plurality of second conductive layers disposed on the second dielectric layer.

26. The HV MOS transistor device of claim 25, wherein one of the second conductive layers is disposed above the first interface.

27. The HV MOS transistor device of claim 25, wherein another second conductive layer is disposed above the second interface.

* * * * *